(12) United States Patent
Mimotogi et al.

(10) Patent No.: US 8,154,710 B2
(45) Date of Patent: Apr. 10, 2012

(54) LITHOGRAPHY PROCESS WINDOW ANALYZING METHOD AND ANALYZING PROGRAM

(75) Inventors: Shoji Mimotogi, Kanagawa (JP); Yasuharu Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 526 days.

(21) Appl. No.: 12/400,677

(22) Filed: Mar. 9, 2009

(65) Prior Publication Data
US 2009/0244512 A1  Oct. 1, 2009

(30) Foreign Application Priority Data
Mar. 25, 2008 (JP) ................................. 2008-078581

(51) Int. Cl.
*G03B 27/32* (2006.01)
*G03B 27/52* (2006.01)
(52) U.S. Cl. ........................................... 355/77; 355/55
(58) Field of Classification Search ................ 355/55, 355/77
See application file for complete search history.

(56) References Cited

U.S. PATENT DOCUMENTS

| | | |
|---|---|---|
| 5,906,903 A | 5/1999 | Mimotogi |
| 6,913,861 B2 * | 7/2005 | Shishido et al. ............ 430/30 |
| 2007/0031745 A1 * | 2/2007 | Ye et al. ............ 430/30 |

OTHER PUBLICATIONS

Mack, C. A. et al., "Improved Model for Focus-Exposure Data Analysis," Metrology, Inspection, and Process Control for Microlithography XVII, Daniel J. Herr Editor, Proceedings of SPIE, vol. 5038, pp. 396-405, (2003).

* cited by examiner

*Primary Examiner* — Edward Glick
*Assistant Examiner* — Michelle Iacoletti
(74) *Attorney, Agent, or Firm* — Finnegan, Henderson, Farabow, Garrett & Dunner, L.L.P.

(57) ABSTRACT

A lithography process window analyzing method for setting a process window based on ranges of exposure amounts and focus positions, and giving evaluation of reliability of the set process window, includes setting, based on a plurality of process conditions including exposure amounts and focus positions in the performed exposure processing, analysis reliability M for process conditions including an arbitrary exposure amount and an arbitrary focus position; calculating reliability R of the process window based on the analysis reliability M concerning the process conditions included in the process window; and comparing a magnitude relation between the reliability R and a predetermined threshold and determining presence or absence of reliability of the process window according to a result of the comparison.

12 Claims, 1 Drawing Sheet

LITHOGRAPHY PROCESS WINDOW ANALYZING METHOD AND ANALYZING PROGRAM

CROSS-REFERENCE TO RELATED APPLICATIONS

This application is based upon and claims the benefit of priority from the prior Japanese Patent Application No. 2008-078581, filed on Mar. 25, 2008; the entire contents of which are incorporated herein by reference.

BACKGROUND OF THE INVENTION

1. Field of the Invention

The present invention relates to a method and a program of analyzing a process window in a lithography process.

2. Description of the Related Art

In a manufacturing process for semiconductor devices, lithography is used as a technique for forming a fine circuit pattern (hereinafter, "pattern") on a wafer. In a lithography process, photosensitive resin (resist) is applied over the wafer and the pattern is transferred onto the wafer by using an exposing apparatus. In transferring the pattern, to secure a desired property of the semiconductor device, it is necessary to control the dimensions of the transferred pattern to be set within an allowable range determined from design conditions.

The dimensions of the pattern can be adjusted according to an exposure amount and a focus position in an exposing process. Therefore, in work called exposure condition setting in the lithography process, exposure processing is actually applied to the wafer with the exposure amount and the focus position changed and the dimensions of a formed pattern is measured to obtain optimum values of the exposure amount and the focus position. In obtaining optimum values, a range (a process window) concerning the exposure amount and the focus position for setting the dimensions of the pattern within an allowable range is created. Center values of the process window are set as the optimum values. In other words, the process window represents an allowable range including the optimum values concerning the exposure amount and the focus position.

When process window for lithography is experimentally obtained, the exposure amount and the focus position are changed on one wafer and an exposure position is simultaneously moved, exposure processing is carried out a plurality of times, and the dimensions of patterns formed in the exposure processing are measured respectively. Samples are created for a plurality of different sets of exposure amounts and focus positions. The exposure positions on the wafer are moved to prevent exposure shots from overlapping one another. To sufficiently open the process window, it is necessary to appropriately set ranges of change in the exposure amounts and the focus positions in performing the sample creation. In other words, it is necessary to appropriately set the ranges of change to include the process window. For that purpose, in the creation of sample patterns, it is desirable to, for example, allocate the exposure amounts and the focus positions such that an exposure amount and a focus potion giving optimum dimensions are present near the center of the wafer, i.e., present in the center of the ranges of the changed exposure amounts and focus positions.

However, when a shot size is large, a method of allocating the exposure amounts and the focus positions may be inappropriate and the ranges of change in the exposure amounts and the focus positions may be inappropriate. In other words, the exposure amount and the focus position giving the optimum dimensions may deviate from the center of the wafer.

In such a case, an experiment only has to be performed again to create samples again such that optimum dimensions are formed in the center of the wafer. However, an experiment often cannot be performed because of time and cost. Therefore, measured dimensions only have to be extrapolated to calculate a process window for lithography. However, in the past, reliability of the extrapolation is not clearly defined. For example, a method of improving a model for fitting measured dimensions as a curve is described in Chris A. Mack and Jeffery D. Byers, 'Improved Model for Focus-Exposure Data Analysis', Metrology, Inspection, and Process Control for Microlithography XVII, Daniel J. Herr, Editor, Proceedings of SPIE, Vol. 5038, pp. 396 to 405 (2003). However, even if such a model is applied to create a process window and extract exposure conditions, the exposure conditions may be outside an allowable range because reliability of an extrapolation range is unclear. Therefore, when semiconductor devices are manufactured by using such inappropriate exposure conditions, yield cannot be secured.

BRIEF SUMMARY OF THE INVENTION

A lithography process window analyzing method according to an embodiment of the present invention for performing exposure processing a plurality of number of times with an exposure amount and a focus position changed on a photosensitive substrate, measuring dimensions of a plurality of circuit patterns transferred onto the photosensitive substrate, setting a process window based on ranges of exposure amounts and focus positions for setting at least the dimensions of the circuit patterns within an allowable range in design, and giving evaluation of reliability of the set process window, comprises setting, based on a plurality of process conditions including exposure amounts and focus positions in the performed exposure processing, analysis reliability M for process conditions including an arbitrary exposure amount and an arbitrary focus position; calculating reliability R of the process window based on the analysis reliability M concerning the process conditions included in the process window; and comparing a magnitude relation between the reliability R and a predetermined threshold and determining presence or absence of reliability of the process window according to a result of the comparison.

A lithography process window analyzing program, according to another embodiment of the present invention, evaluating, based on a result of performing exposure processing a plurality of number of times with an exposure amount and a focus position changed on a photosensitive substrate and measuring dimensions of a plurality of circuit patterns transferred onto the photosensitive substrate, a process window set based on ranges of exposure amounts and focus positions for setting at least the dimensions of the circuit patterns within an allowable range in design, causes a computer to set, based on a plurality of process conditions including exposure amounts and focus positions in the performed exposure processing, analysis reliability M for process conditions including an arbitrary exposure amount and an arbitrary focus position; calculate reliability R of the process window based on the analysis reliability M concerning points included in the process window; and compare a magnitude relation between the reliability R and a predetermined threshold, determine presence or absence of reliability of the process window according to a result of the comparison, and output a result of the determination.

DETAILED DESCRIPTION OF THE INVENTION

Exemplary embodiments of a lithography process window analyzing method and a lithography process window analyzing program according to the present invention will be explained below in detail with reference to the accompanying drawings. The present invention is not limited to the following embodiments.

In a lithography process, a pattern is transferred onto a photosensitive substrate, which is formed by applying photosensitive resin (resist) over a wafer, by using an exposing apparatus. The exposing apparatus includes an illumination optical system having an illumination light source and the like, a reticle stage that is arranged below the illumination optical system and on which a photomask is set, a projection optical system that is arranged below the reticle stage and projects light transmitted through the reticle stage onto the wafer, and a wafer stage that is arranged below the projection optical system and on which the wafer is set. The wafer having the pattern transferred thereon is developed and etched by a developing device and the like. Then, a line width as a dimension value of the pattern is measured by a line width measuring device.

The dimensions of the pattern formed on the wafer as explained above depend on an exposure amount and a focus position of the exposing apparatus. Therefore, in exposure condition setting, a plurality of samples of patterns corresponding to different exposure amounts and focus positions are created on the wafer and dimensions of the patterns are measured. A process window is calculated based on exposure amounts and focus positions of a sample group for which measured values of the dimensions are within an allowable range. However, when ranges of change in the exposure amounts and the focus positions are inappropriate, the process window may not be able to be sufficiently opened. In such a case, it is preferable to perform extrapolation of the process window. However, it is necessary to define reliability of an extrapolated portion.

Figure 1:
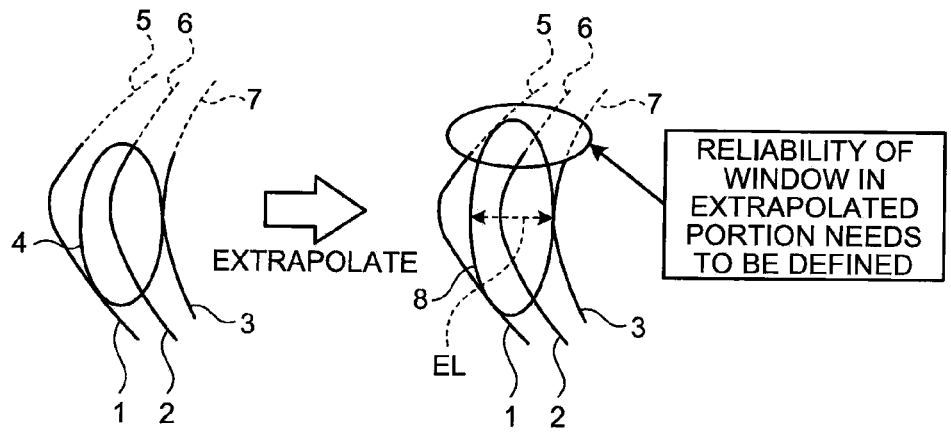
FIG. 1 is a diagram of an example of a process window for lithography calculated by extrapolation in an embodiment of the present invention.

FIG. 1 is a diagram of an example of a process window for lithography calculated by extrapolation. The left side of an arrow represents a process window before extrapolation and the right side of the arrow represents a process window after the extrapolation. In FIG. 1, an exposure amount—focus space is shown. The lateral direction represents an exposure amount and the longitudinal direction represents a focus position. As the focus position, for example, focus depth can be adopted.

Curves 1 and 3 indicated by solid lines are curves (exposure amount—focus curves) obtained by connecting points representing exposure amounts and focus positions corresponding to upper and lower limits of an allowable range of dimensions of a pattern formed by exposure shots. Specifically, for example, when an allowable dimension error is set to ±10% as the allowable range, an exposure amount—focus curve concerning an exposure amount and a focus position corresponding to +10% is equivalent to the curve 1. An exposure amount—focus curve concerning an exposure amount and a focus position corresponding to −10% is equivalent to the curve 3. A curve 2 indicated by a solid line represents an exposure amount—focus curve corresponding to optimum values of dimensions of a pattern formed by exposure. Like the curves 1 and 3, the curve 2 represents an exposure amount and a focus position of exposure shots actually performed. The curves 1 to 3 are referred to as ED-tree.

On the other hand, curves 5, 6, and 7 indicated by dotted lines are curves obtained by extrapolating the curves 1, 2, and 3, respectively. Whereas the solid lines represent measured values, the dotted lines represent extrapolated areas not actually used for exposure. Various methods can be used as an extrapolation method. As a simple choice, for example, polynomial approximation can be used.

On the left side of the arrow shown in FIG. 1, a process window 4 is opened in a range specified by the curves 1 and 3 formed by exposure amounts and focus positions with which dimension measurement is actually performed. The process window 4 is defined as an area on an inner side of the range specified by the curves 1 and 3 representing an allowance boundary. In this embodiment, a shape of the process window is, for example, an ellipse. However, the shape of the process window is not limited to this and may be other shapes such as a rectangle.

On the right side of the arrow shown in FIG. 1, a process window 8 is opened in an extended range specified by the curves 1 and 3 and the curves 5 and 7 obtained by extrapolating the curves 1 and 3. The process window 4 is extrapolated to the process window 8 by extrapolating exposure—focus curves (the curves 1 and 3). The process window 8 is formed in an elliptical shape, a diameter in a longitudinal direction (in this case, a focus direction) of which is longer than that of the process window 4. In FIG. 1, the extrapolation of the curves 1 and 3 is performed upward in the figure. However, this is only an example and the extrapolation can be performed downward in the figure.

In the process window 8, reliability of an extrapolated portion poses a problem. Because the extrapolated portion is not a measured value, it is not guaranteed whether the portion actually gives an exposure amount and a focus position for setting the dimensions of a pattern within an allowable range. An index defining such reliability is not present. Therefore, it is necessary to define analysis reliability of the extrapolated portion to define reliability of the process window.

Figure 2:
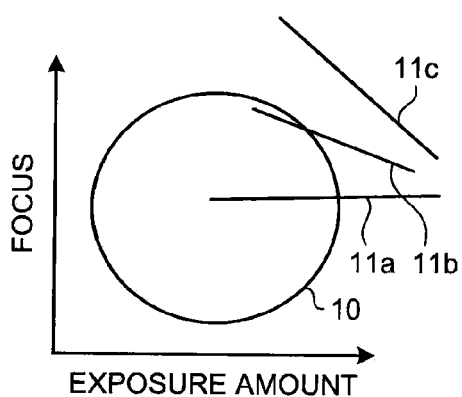
FIG. 2 is a diagram of an example of an area (a focus exposure matrix (FEM) sampling space) in which exposure processing is performed and dimension measurement is executed in an exposure amount—focus space.

FIG. 2 is a diagram of an example of an area (a focus exposure matrix (FEM) sampling space) in which exposure processing is performed and dimension measurement is executed in an exposure amount—focus space. In FIG. 2, an FEM sampling space 10 represents a set of points of exposure amounts and focus positions of all exposure shots for which dimension measurement is executed. As an example, the set of points is located on a circumference and the inside of the circumference.

The reliability of analysis is different on the inside and the outside of the FEM sampling space 10. Even on the inside of the FEM sampling space 10, the reliability of analysis is different near the center and near the circumference. For example, the reliability of analysis changes when a point moves from the center of a circle to the outside along a line segment 11a. The reliability of analysis also changes when points move in the same manner along line segments 11b and 11c. Therefore, in this embodiment, first, the analysis reliability for points of an arbitrary exposure amount (E) and an arbitrary focus position (F) (process conditions) is defined by M calculated from Formula 1 based on points of exposure amounts and focus positions for which dimension measurement is executed (process conditions) (i.e., based on points in the FEM sampling space).

$$M = \sqrt{\left(\frac{E-E_0}{p\sigma_E}\right)^2 + \left(\frac{F-F_0}{p\sigma_F}\right)^2} \quad \text{Formula 1}$$

In Formula 1, $E_0$ and $F_0$ respectively represent averages of exposure amounts and focus positions of all exposure shots for which dimension measurement is performed. $\sigma_E$ and $\sigma_F$ respectively represent square roots of dispersion of the exposure amounts and the focus positions. "p" represents a positive real number that can be arbitrarily set and usually takes a value of about 3. When "p" is set to 3, M is defined with reliability of 3σ as a reference. As it is seen from Formula 1, M increases as (E, F) are farther away from the averages ($E_0$, $F_0$).

Formula 1 defines, based on sample points in the FEM sampling space, analysis reliability of an arbitrary point in the exposure amount—focus space using generalized distance like Mahalanobis' distance. The definition of M is not limited to Formula 1 and various definitions are possible. For example, M can be defined by Formula 2.

$$M = \quad \text{Formula 2}$$
$$\begin{cases} \sqrt{\left(\frac{E-E_0}{p\sigma_E}\right)^2 + \left(\frac{F-F_0}{p\sigma_F}\right)^2} & : \left(\frac{E-E_0}{p\sigma_E}\right)^2 + \left(\frac{F-F_0}{p\sigma_F}\right)^2 > 1 \\ 1 & : \left(\frac{E-E_0}{p\sigma_E}\right)^2 + \left(\frac{F-F_0}{p\sigma_F}\right)^2 \leq 1 \end{cases}$$

$E_0$, $F_0$, $\sigma_E$, $\sigma_F$ and p are the same as those in Formula 1. In Formula 2, M is set to 1 in the inside of an ellipse having the center in ($E_0$, $F_0$), a diameter $p\sigma_E$ in an E axis direction, and a diameter $p\sigma_F$ in an F axis direction in the exposure amount—focus space. In the outside of the ellipse, M is defined in the same manner as Formula 1.

Reliability R of a process window is defined by Formula 3 using this analysis reliability M.

$$R = \frac{\iint_{window} M^\alpha dEdF}{\iint_{window} dEdF} \quad \text{Formula 3}$$

In Formula 3, α represents a negative real number that can be arbitrarily set. For example, α is about −1. An integral domain (a window) represents an inner area of a process window as a target of reliability evaluation.

In a numerator on the right side of Formula 3, the analysis reliability M for respective points in the inside of the process window is calculated based on Formula 1 or 2, $M^\alpha$ is calculated, and $M^\alpha$ is integrated with respect to the integral domain (the window). A denominator on the right side of Formula 3 performs normalization. In this way, $M^\alpha$ is averaged with respect to the process window and reliability of the process window is calculated. An experimenter can evaluate, with this reliability R as an index, the reliability of the process window including reliability realized when the process window is extrapolated and can determine propriety of application of the process window based on the reliability R. Specifically, for example, determination criteria can be set to apply the process window to a semiconductor manufacturing process when the reliability R is equal to or larger than a predetermined threshold and not to apply the process window to the semiconductor manufacturing process when the reliability R is smaller than the predetermined threshold.

A negative power of M is integrated in the definition of the reliability R because, in Formula 1 or Formula 2, the analysis reliability M is defined to increase as the arbitrary exposure amount and the arbitrary focus position are farther away from the averages ($E_0$, $F_0$). In general, reliability is lower as portions away from averages are larger. Therefore, in a relation with the definition of M, the reliability R is defined to be the same as the meaning of the usual reliability.

Figure 3:
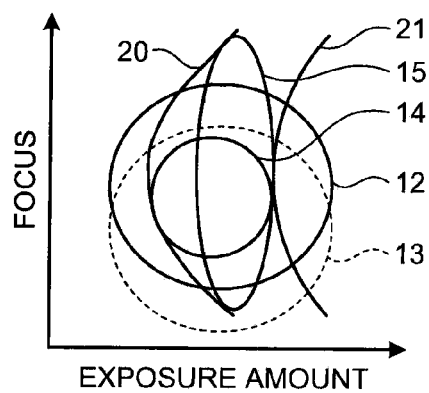
FIG. 3 is a diagram for explaining a difference in reliability of process windows opened based on two different FEM sampling spaces in the embodiment.

FIG. 3 is a diagram for explaining a difference in reliability of process windows opened based on two different FEM sampling spaces. In FIG. 3, in an exposure amount—focus space with an exposure amount plotted on the abscissa and a focus position plotted on the ordinate, a first FEM sampling space 12 and a second FEM sampling space 13 different from the first FEM sampling space 12 are shown.

Curves 20 and 21 are obtained by extrapolating exposure amount—focus curves corresponding to upper and lower limits of an allowable range of the dimensions of a pattern. Specifically, when the curves 20 and 21 are calculated based on sample points in the first FEM sampling space 12, portions of the curves 20 and 21 in the first FEM sampling space 12 are portions calculated based on measured values (equivalent to the curves 1 and 3 shown in FIG. 1). Portions of the curves 20 and 21 outside the first FEM sampling space 12 are portions calculated based on extrapolation (equivalent to the curves 5 and 7 shown in FIG. 1). Similarly, when the curves 20 and 21 are calculated based on sampling points in the second FEM sampling space 13, portions of the curves 20 and 21 in the second FEM sampling space 13 are portions calculated based on measured values (equivalent to the curves 1 and 3 shown in FIG. 1). Portions of the curves 20 and 21 outside the second FEM sampling space 13 are portions calculated based on extrapolation (equivalent to the curves 5 and 7 shown in FIG. 1).

In FIG. 3, as an example, process windows 14 and 15 are opened on an inner side of a range specified by the curves 20 and 21 representing an allowance boundary. These two process windows are different in the length of a diameter in the abscissa (exposure amount) direction, which represents a degree of freedom of process window creation. The length of a diameter in the exposure amount direction of an elliptical or circular process window is represented by an exposure latitude (EL) (see FIG. 1).

When reliabilities R of the process windows 14 and 15 are evaluated, values of the reliabilities R are different depending on whether the reliabilities R are evaluated based on the first FEM sampling space 12 or evaluated based on the second FEM sampling space 13. This is because, in the exposure amount—focus space, relative positional relations of the process windows 14 and 15 to the first FEM sampling space 12 or the second FEM sampling space 13 are different. For example, when the reliability R of the process window 15 is evaluated, if the reliability R is evaluated based on the first FEM sampling space 12, it is anticipated that the reliability R is high because an extrapolated portion is not so large. On the other hand, if the reliability R is evaluated based on the second FEM sampling space 13, it is anticipated that the reliability R is low because an extrapolated portion is large on an upper side of the process window 15.

Figure 4:
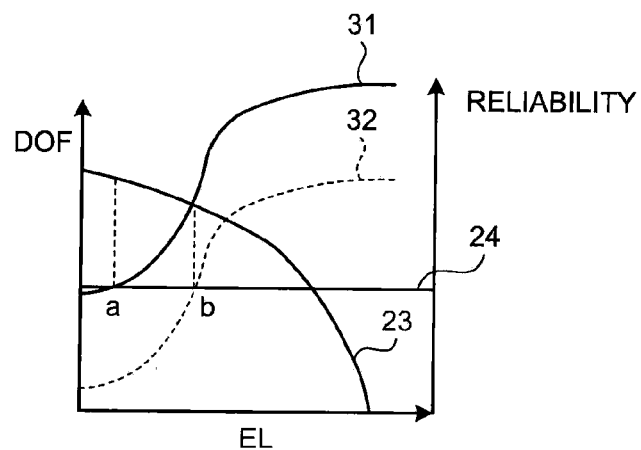
FIG. 4 is a diagram in which analysis results and values of reliabilities based on the two FEM sampling spaces shown in FIG. 3 are plotted in the embodiment.

FIG. 4 is a diagram in which analysis results and values of reliabilities based on the two FEM sampling spaces 12 and 13 shown in FIG. 3 are plotted. In FIG. 4, the abscissa represents an EL of a process window and the ordinate represents depth of focus (DOF) or the reliability R. Specifically, with respect to a focus depth curve 23, the ordinate represents the depth of focus (DOF). With respect to reliability curves 31 or 32, the ordinate represents the reliability R.

The focus depth curve 23 indicates, when a process window is opened in the range specified by the curves 20 and 21 representing the allowance boundary in FIG. 3, the DOF as diameter length in the focus position direction of the process window changes according to the EL as diameter length in the exposure amount direction of the process window. Specifically, the focus depth curve 23 indicates that the DOF increases when the process window is opened with the EL set small. This matches the relation between the process windows 14 and 15 shown in FIG. 3.

The reliability curve 31 is a curve obtained by plotting, according to the EL, the reliability R of a process window opened based on the FEM sampling space 12 shown in FIG. 3. For example, Formula 1 is used to calculate the analysis reliability M of points in the process window. Formula 2 is used to calculate the reliability R. Similarly, the reliability curve 32 is a curve obtained by plotting, according to the EL, the reliability R of a process window opened based on the FEM sampling space 13 shown in FIG. 3. As shown in FIG. 3, it is quantitatively seen that the reliability R (the reliability curve 31) of the process window opened based on the FEM sampling space 12 is higher than the reliability R (the reliability curve 32) of the process window opened based on the FEM sampling space 13. When a process condition in the center (an average) of a process window and a process condition in the center (an average) of an FEM sampling space are close to each other, the reliability R is large. When the process conditions are far from each other, the reliability R is small.

The experimenter sets a threshold 24 and compares the reliability curve 31 or 32 with the threshold 24. When the reliability curve 31 or 32 is equal to or larger than the threshold 24, the experimenter can determine that reliability of a process window is secured and apply this process window to a semiconductor manufacturing process. When the reliability curve 31 or 32 is smaller than the threshold 24 as a result of the comparison, the experimenter can determine that reliability of a process window is not secured and minimize an error in exposure condition setting without applying this process window to the semiconductor manufacturing process. It is seen that, with respect to the reliability curve 31, reliability is secured for a process window with the EL equal to or larger than "a" and, with respect to the reliability curve 32, reliability is secured for a process window with the LE equal to or larger than "b". In this way, a degree of freedom of selection is larger when the process window is opened based on the FEM sampling space 12.

As it is evident from the above explanation, the reliability R of a process window can be applied not only when the process window is extrapolated but also when the process window is generally obtained, for example, when the process window is calculated based on only measured values.

The lithography process window analyzing method explained above can be realized by a lithography process window analyzing system that operates according to the analyzing method. In particular, the lithography process window analyzing method can be realized by a computer, operations of which are controlled by a program in which a procedure of the analyzing method is described. In realizing the lithography process window analyzing method, it is possible to use a hardware configuration including a normal computer including a control device such as a central processing unit (CPU), storage devices such as a read only memory (ROM) and a random access memory (RAM), an external storage device such as a hard disk (HD), a display device such as a display, and input devices such as a keyboard and a mouse.

According to this embodiment, evaluation of reliability of a process window can be given, including, for example, the case when the process window is extrapolated and calculated. Therefore, it is possible to minimize an error in exposure condition setting in the lithography process and secure yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lithography process window analyzing method for performing exposure processing a plurality of times with an exposure amount and a focus position changed on a photosensitive substrate, measuring dimensions of a plurality of circuit patterns transferred onto the photosensitive substrate, setting a process window based on ranges of exposure amounts and focus positions for setting at least the dimensions of the circuit patterns within an allowable range in design, and evaluating reliability of the set process window, the lithography process window analyzing method comprising:

setting, based on a plurality of process conditions including exposure amounts and focus positions in the performed exposure processing, analysis reliability M, wherein analysis reliability M is related to a reliability of process conditions and includes an arbitrary exposure amount and an arbitrary focus position;

calculating, via a computer, reliability R, wherein reliability R is a reliability of the process window based on the analysis reliability M concerning the process conditions included in the process window; and comparing a magnitude relation between the reliability R and a predetermined threshold and determining presence or absence of reliability of the process window according to a result of the comparison, wherein the process window includes an area obtained from measured value of the exposure processing and an area obtained by extrapolating the area obtained from the measured value, and wherein, based on the process conditions including the exposure amounts and the focus positions, after allowance boundary curves are calculated as boundary of an allowable range in design of the dimensions of the circuit patterns concerning the process conditions and including the exposure amounts and the focus positions in the performed exposure processing and the allowance boundary curves are extrapolated, the process window is defined in an area between the extrapolated allowance boundary curves.

2. The lithography process window analyzing method according to claim 1, wherein the analysis reliability M for process conditions including an arbitrary exposure amount E and an arbitrary focus position F is set by Formula 1 or Formula 2 using an average of exposure amounts $E_o$, an average of the focus positions $F_o$, a square root of dispersion of the exposure amounts $\sigma_E$, and a square root of dispersion of the focus positions $\sigma_F$ calculated based on the process conditions including the exposure amounts and the focus positions in the performed exposure processing:

$$M = \sqrt{\left(\frac{E-E_0}{p\sigma_E}\right)^2 + \left(\frac{F-F_0}{p\sigma_F}\right)^2} \quad \text{Formula 1}$$

$$M = \begin{cases} \sqrt{\left(\frac{E-E_0}{p\sigma_E}\right)^2 + \left(\frac{F-F_0}{p\sigma_F}\right)^2} & : \left(\frac{E-E_0}{p\sigma_E}\right)^2 + \left(\frac{F-F_0}{p\sigma_F}\right)^2 > 1 \\ 1 & : \left(\frac{E-E_0}{p\sigma_E}\right)^2 + \left(\frac{F-F_0}{p\sigma_F}\right)^2 \leq 1 \end{cases} \quad \text{Formula 2}$$

where, "p" is a positive real number.

3. The lithography process window analyzing method according to claim 2, wherein "p" is 3.

4. The lithography process window analyzing method according to claim 2, wherein the reliability R is calculated by Formula 3 using the analysis reliability M:

$$R = \frac{\iint_{window} M^\alpha dEdF}{\iint_{window} dEdF} \quad \text{Formula 3}$$

where, "window" represents an inner area of the process window as an integral domain and α is a negative real number.

5. The lithography process window analyzing method according to claim 4, wherein α is −1.

6. The lithography process window analyzing method according to claim 4, wherein it is determined when the reliability R is equal to or larger than the predetermined threshold that reliability of the process window is secured.

7. A not-transitory computer-readable medium encoded with a lithography process window analyzing program for evaluating, based on a result of performing exposure processing a plurality of times with an exposure amount and a focus position changed on a photosensitive substrate and measuring dimensions of a plurality of circuit patterns transferred onto the photosensitive substrate, a process window set based on ranges of exposure amounts and focus positions for setting at least the dimensions of the circuit patterns within an allowable range in design, the lithography process window analyzing program causing a computer to:

set, based on a plurality of process conditions including exposure amounts and focus positions in the performed exposure processing, analysis reliability M for process conditions including an arbitrary exposure amount and an arbitrary focus position;

calculate reliability R of the process window based on the analysis reliability M concerning points included in the process window; and compare a magnitude relation between the reliability R and a predetermined threshold, determine presence or absence of reliability of the process window according to a result of the comparison, and output a result of the determination, wherein the process window includes an area obtained from measured value of the exposure processing and an area obtained by extrapolating the area obtained from the measured value, and wherein, based on the process conditions including the exposure amounts and the focus positions, after allowance boundary curves are calculated as boundary of an allowable range in design of the dimensions of the circuit patterns concerning the process conditions including the exposure amounts and the focus positions in the performed exposure processing and the allowance boundary curves are extrapolated, the process window is defined in an area between the extrapolated allowance boundary curves.

8. The not-transitory computer-readable medium according to claim 7, wherein the analysis reliability M for process conditions including an arbitrary exposure amount E and an arbitrary focus position F is set by Formula 1 or Formula 2 using an average of exposure amounts $E_0$, an average of the focus positions $F_0$, a square root of dispersion of the exposure amounts $\sigma_E$, and a square root of dispersion of the focus positions $\sigma_F$ calculated based on the process conditions including the exposure amounts and the focus positions in the performed exposure processing:

$$M = \sqrt{\left(\frac{E-E_0}{p\sigma_E}\right)^2 + \left(\frac{F-F_0}{p\sigma_F}\right)^2} \quad \text{Formula 1}$$

$$M = \begin{cases} \sqrt{\left(\frac{E-E_0}{p\sigma_E}\right)^2 + \left(\frac{F-F_0}{p\sigma_F}\right)^2} & : \left(\frac{E-E_0}{p\sigma_E}\right)^2 + \left(\frac{F-F_0}{p\sigma_F}\right)^2 > 1 \\ 1 & : \left(\frac{E-E_0}{p\sigma_E}\right)^2 + \left(\frac{F-F_0}{p\sigma_F}\right)^2 \leq 1 \end{cases} \quad \text{Formula 2}$$

where, "p" is a positive real number.

9. The not-transitory computer-readable medium according to claim 8, wherein "p" is 3.

10. The not-transitory computer-readable medium according to claim 8, wherein the reliability R is calculated by Formula 3 using the analysis reliability M:

$$R = \frac{\iint_{window} M^\alpha dEdF}{\iint_{window} dEdF} \quad \text{Formula 3}$$

where, "window" represents an inner area of the process window as an integral domain and α is a negative real number.

11. The not-transitory computer-readable medium according to claim 10, wherein α is −1.

12. The not-transitory computer-readable medium according to claim 10, wherein it is determined when the reliability R is equal to or larger than the predetermined threshold that reliability of the process window is secured.

* * * * *